United States Patent
Yanagi et al.

(10) Patent No.: US 12,120,861 B2
(45) Date of Patent: Oct. 15, 2024

(54) ELECTROMAGNETIC WAVE SHIELDING FILM AND SHIELDED PRINTED WIRING BOARD

(71) Applicant: TATSUTA ELECTRIC WIRE & CABLE CO., LTD., Higashiosaka (JP)

(72) Inventors: Yoshiharu Yanagi, Kyoto (JP); Hiroshi Tajima, Kyoto (JP)

(73) Assignee: TATSUTA ELECTRIC WIRE & CABLE CO., LTD., Higashiosaka (JP)

(*) Notice: Subject to any disclaimer, the term of this patent is extended or adjusted under 35 U.S.C. 154(b) by 0 days.

(21) Appl. No.: 18/044,529

(22) PCT Filed: Sep. 22, 2021

(86) PCT No.: PCT/JP2021/034857
§ 371 (c)(1),
(2) Date: Mar. 8, 2023

(87) PCT Pub. No.: WO2022/065380
PCT Pub. Date: Mar. 31, 2022

(65) Prior Publication Data
US 2023/0337408 A1  Oct. 19, 2023

(30) Foreign Application Priority Data

Sep. 23, 2020  (JP) ................. 2020-158576

(51) Int. Cl.
*H05K 9/00* (2006.01)
*H05K 1/02* (2006.01)
(52) U.S. Cl.
CPC ........... *H05K 9/0088* (2013.01); *H05K 1/023* (2013.01)
(58) Field of Classification Search
CPC .................................................. H05K 9/0088
See application file for complete search history.

(56) References Cited

U.S. PATENT DOCUMENTS

| | | | |
|---|---|---|---|
| 10,820,457 B1* | 10/2020 | Kishi | ............ B32B 3/266 |
| 2015/0136219 A1 | 5/2015 | Koike et al. | |
| 2018/0308603 A1 | 10/2018 | Okano et al. | |

FOREIGN PATENT DOCUMENTS

| | | |
|---|---|---|
| JP | 2011096599 A | 5/2011 |
| JP | 2012067327 A | 4/2012 |

(Continued)

OTHER PUBLICATIONS

Machine Translation for JP 2016076444 (Hori et al), Electrically conductive Paste, specification 16 pages, translated on Feb. 24, 2024. (Year: 2016).*

(Continued)

*Primary Examiner* — Hung V Ngo
(74) *Attorney, Agent, or Firm* — United IP Counselors, LLC; Kenneth M. Fagin

(57) ABSTRACT

An electromagnetic wave shielding film that can be thinned, and has high peel strength, electroconductivity, shielding properties, and flex resistance and conformability to a step is provided. An electromagnetic wave shielding film of the present invention is an electromagnetic wave shielding film including: an electroconductive adhesive layer containing electroconductive particles and an adhesive resin composition, wherein the electroconductive particles contain flaky electroconductive particles and spherical electroconductive particles, the average particle size of the spherical electroconductive particles is 1 to 10 μm, the content of the flaky electroconductive particles and the spherical electroconductive particles in the electroconductive adhesive layer is 70 to 80% by weight, the weight ratio of the flaky electroconductive particles to the spherical electroconductive particles, [flaky electroconductive particles]/[spherical electroconductive particles], is 6/4 to 8/2, and the thickness of the electroconductive adhesive layer is 5 to 20 μm.

7 Claims, 7 Drawing Sheets

(56) References Cited

FOREIGN PATENT DOCUMENTS

| | | |
|---|---|---|
| JP | 2012248399 A | 12/2012 |
| JP | 2013008810 A | 1/2013 |
| JP | 2013258128 A | 12/2013 |
| JP | 2015105372 A | 6/2015 |
| JP | 2016076444 A | 5/2016 |
| JP | 2016115725 A | 6/2016 |
| JP | 2017069175 A | 4/2017 |
| JP | 2018060987 A | 4/2018 |

OTHER PUBLICATIONS

International Search Report issued in International Application No. PCT/JP2021/034857, dated Dec. 21, 2021.
Written Opinion issued in International Application No. PCT/JP2021/034857, dated Dec. 21, 2021.

* cited by examiner

ELECTROMAGNETIC WAVE SHIELDING FILM AND SHIELDED PRINTED WIRING BOARD

TECHNICAL FIELD

The present invention relates to an electromagnetic wave shielding film and a shielded printed wiring board.

BACKGROUND ART

Flexible printed wiring boards have been frequently used to incorporate circuits into complicated mechanisms in mobile equipment such as mobile phones and electronic equipment such as video cameras and notebook computers, which are rapidly progressing in downsizing and functionalization. Moreover, flexible printed wiring boards have also been used to connect movable parts such as printer heads to control units by making use of excellent flexibility thereof. This electronic equipment requires electromagnetic wave shielding measures. Among flexible printed wiring boards to be used in apparatuses, flexible printed wiring boards with electromagnetic wave shielding measures (hereinafter also described as "shielded printed wiring boards") have been increasingly used.

Mobile equipment is required to be multifunctional (equipped with, for example, cameras, GPS functions, and the like). In order to achieve such multifunctionality, the densities of printed wiring boards have been increased. Especially in recent years, electromagnetic wave shielding films are required to have a higher shielding effect to cope with improvement in the performance of mobile equipment based on the 5G communication standard having a communication frequency of as high as 10 GHz. When printed wiring boards are highly densely arranged, a method for thinning the thicknesses of the shielded printed wiring boards is adopted due to a limit to the enlargement of mobile equipment itself. When the thicknesses of the shielded printed wiring boards are thinned, a method for thinning electromagnetic wave shielding films is devised.

However, if the thickness of an electromagnetic wave shielding film is thin, the thermocompression bonding of the electromagnetic wave shielding film to a printed wiring board having a step stretches the electroconductive adhesive layer of the electromagnetic wave shielding film on the step, and may increase its electrical resistance value or damage the electromagnetic wave shielding film itself.

Patent Literature 1 discloses an electromagnetic wave shielding sheet as an electromagnetic wave shielding film (electromagnetic wave shielding sheet) that enables solving such a problem. The electromagnetic wave shielding sheet includes an electrically conductive layer containing flaky electroconductive particulates and a binder resin and an insulating layer, in which the average aspect ratio of the flaky electroconductive particulates in a cut surface of the electrically conductive layer is 7 to 15, an area occupied by components other than the electroconductive particulates is 55 to 80 when the cross-sectional area of the electrically conductive layer before thermocompression bonding is defined as 100, and a difference in area occupied by the components other than the electroconductive particulates before and after the thermocompression bonding under the conditions of 150° C., 2 MPa, and 30 minutes is 5 to 25 when the cross-sectional area of the electrically conductive layer before thermocompression bonding is defined as 100.

CITATION LIST

Patent Literature

Patent Literature 1: JP 2016-115725 A

SUMMARY OF INVENTION

Technical Problem

In the shielded printed wiring board including the electromagnetic wave shielding film described in Patent Literature 1, flaky electroconductive particulates may be located on the interface between the electrically conductive layer and the insulating layer and on the interface between the electrically conductive layer and the printed wiring board. As a result, an area of the bonded surface between the electrically conductive layer and the insulating layer or an area of the contact surface between the electrically conductive layer and the printed wiring board becomes smaller, and the peel strength of the electrically conductive layer may decrease.

Therefore, there has been a problem that the insulating layer of the electromagnetic wave shielding film peeled off, or the electromagnetic wave shielding film itself peeled off the printed wiring board in use.

In addition, when the electromagnetic wave shielding film is arranged on the printed wiring board having steps, the electromagnetic wave shielding film may be ruptured by the steps in some cases, or may be separated without following the steps satisfactorily. Thus, it is desired to improve the flex resistance and the conformability to the steps.

The present invention is an invention that has been made to solve the above-mentioned problem, and an object of the present invention is to provide an electromagnetic wave shielding film that can be thinned, and has high peel strength, electroconductivity, shielding properties, and flex resistance and conformability to a step.

Solution to Problem

An electromagnetic wave shielding film of the present invention includes: an electroconductive adhesive layer containing electroconductive particles and an adhesive resin composition, the electroconductive particles including flaky electroconductive particles and spherical electroconductive particles, an average particle size of the spherical electroconductive particles being 1 to 10 μm, a content of the flaky electroconductive particles and the spherical electroconductive particles in the electroconductive adhesive layer being 70 to 80% by weight, a weight ratio of the flaky electroconductive particles to the spherical electroconductive particles, [flaky electroconductive particles]/[spherical electroconductive particles], being 6/4 to 8/2, a thickness of the electroconductive adhesive layer being 5 to 20 μm.

In the electromagnetic wave shielding film of the present invention, the electroconductive particles include flaky electroconductive particles and spherical electroconductive particles.

Since the flaky electroconductive particles have sufficient flexibility, in folding the electromagnetic wave shielding film repeatedly, the flaky electroconductive particles can also follow the electromagnetic wave shielding film and be bent, and the flaky electroconductive particles are hardly displaced. Consequently, the contact between electroconductive particles can be fully maintained, and an increase in the electrical resistance value can be prevented.

When the spherical electroconductive particles are contained, spherical electroconductive particles are inserted between flaky electroconductive particles in the thickness direction of the electroconductive adhesive layer, and a large amount of the adhesive resin composition exists between the flaky electroconductive particles. Therefore, the mechanical strength of the electroconductive adhesive layer is improved, and the peel strength increases.

The spherical electroconductive particles are between the flaky electroconductive particles, and the flaky electroconductive particles are electrically connected through the spherical electroconductive particles. Therefore, the shielding properties of the electroconductive adhesive layer are improved.

The term "flaky electroconductive particles" used herein means electroconductive particles having an aspect ratio of 18 or more in the cut surface of the electroconductive adhesive layer after the electromagnetic wave shielding film is thermocompression bonded under the conditions of 150° C., 2 MPa, and 30 minutes.

The term "spherical electroconductive particles" used herein means electroconductive particles having an aspect ratio of less than 18 in the cut surface of the electroconductive adhesive layer after the electromagnetic wave shielding film is thermocompression bonded under the conditions of 150° C., 2 MPa, and 30 minutes.

The expression "aspect ratio of the electroconductive particles in the cut surface of the electroconductive adhesive layer" used herein means an average value of the aspect ratios of the electroconductive particles deduced from an SEM image of the cross section obtained by cutting the electromagnetic wave shielding film after the electromagnetic wave shielding film is thermocompression bonded under the conditions of 150° C., 2 MPa, and 30 minutes. Specifically, the major axes and the minor axes of 100 electroconductive particles per image are measured in image data photographed at a photographing magnification of 3,000 times using a scanning electron microscope (JSM-6510LA manufactured by JEOL Ltd.) and image processing software (SEM Control User Interface Ver3.10), and the major axes/minor axes of the electroconductive particles are calculated, and the average value of numerical values except numerical values in the ranges from the upper and lower limits to 15% is defined as the aspect ratio.

In the electromagnetic wave shielding film of the present invention, the average particle size of the spherical electroconductive particles is 1 to 10 μm.

If the average particle size of spherical electroconductive particles is less than 1 μm, the spherical electroconductive particles hardly function as three-dimensional obstacles, and the flaky electroconductive particles is easily exposed to the surface of the electroconductive adhesive layer. Consequently, the peel strength of the electroconductive adhesive layer decreases.

If the average particle size of spherical electroconductive particles exceeds 10 μm, the electroconductivity of the electroconductive adhesive layer decreases, and shielding properties decrease.

The term "lengths of the electroconductive particles" used herein means the values of the lengths of the major axes of the particles calculated in an SEM image of a cross section obtained by cutting the electromagnetic wave shielding film using image processing software (SEM Control User Interface Ver3.10).

In the electromagnetic wave shielding film of the present invention, the content of the flaky electroconductive particles and the spherical electroconductive particles in the electroconductive adhesive layer is 70 to 80% by weight.

If the content of the flaky electroconductive particles and the spherical electroconductive particles in the electroconductive adhesive layer is less than 70% by weight, there are few electroconductive particles, and thus the spherical electroconductive particles are hardly inserted between the flaky electroconductive particles. Consequently, the flaky electroconductive particles are hardly electrically connected through the spherical electroconductive particles, and the shielding properties of the electromagnetic wave shielding film decreases.

If the content of the flaky electroconductive particles and the spherical electroconductive particles in the electroconductive adhesive layer exceeds 80% by weight, the content of the adhesive resin composition relatively decreases. Since the peel strength of the electroconductive adhesive layer depends on the content of the adhesive resin composition, the peel strength of the electroconductive adhesive layer decreases.

In the electromagnetic wave shielding film of the present invention, the weight ratio of the flaky electroconductive particles to the spherical electroconductive particles, [flaky electroconductive particles]/[spherical electroconductive particles], is 6/4 to 8/2.

If the weight ratio of the flaky electroconductive particles to the spherical electroconductive particles, [flaky electroconductive particles]/[spherical electroconductive particles], is less than 6/4, the rate of spherical electroconductive particles is too high, and the area in which the flaky electroconductive particles are overlapped decreases, and since many spherical electroconductive particles exist between the flaky electroconductive particles, the interval between the flaky electroconductive particles increases, and the electroconductivity (shielding properties) decreases. In flexing the electromagnetic wave shielding film, the connection between the electroconductive particles is furthermore deteriorated.

If the weight ratio of the flaky electroconductive particles to the spherical electroconductive particles, [flaky electroconductive particles]/[spherical electroconductive particles], exceeds 8/2, the area in which the flaky electroconductive particles are overlapped increases, and the shielding performance is improved, but the interval between the flaky electroconductive particles is narrow. The peel strength of the electroconductive adhesive layer decreases, and this results in the peeling of the electromagnetic wave shielding film off the shielded printed wiring board.

In the electromagnetic wave shielding film of the present invention, the thickness of the electroconductive adhesive layer is 5 to 20 μm.

If the thickness of the electroconductive adhesive layer is less than 5 μm, the filling amount of electroconductive particles increases to secure high shielding performance, and the flexibility and the peel strength cannot be maintained.

When the thickness of the electroconductive adhesive layer exceeds 20 μm, a design for an increase in shielding performance is facilitated, but the electromagnetic wave shielding film cannot be thinned.

The electromagnetic wave shielding film of the present invention may further include an insulating layer.

When the electromagnetic wave shielding film includes an insulating layer, the handleability is improved. The electroconductive adhesive layer can be insulated from the outside.

The electromagnetic wave shielding film of the present invention may include a metal layer between the insulating layer and the electroconductive adhesive layer.

When the electromagnetic wave shielding film includes a metal layer, the electromagnetic wave shielding effect is improved.

A shielded printed wiring board of the present invention includes: a printed wiring board including a base film; a printed circuit arranged on the base film, and a coverlay arranged so as to cover the printed circuit; and an electromagnetic wave shielding film including an electroconductive adhesive layer containing electroconductive particles and an adhesive resin composition, the electromagnetic wave shielding film being arranged on the printed wiring board such that the electroconductive adhesive layer is in contact with the coverlay, the electroconductive particles including flaky electroconductive particles and spherical electroconductive particles, the average particle size of the spherical electroconductive particles being 1 to 10 μm, the content of the flaky electroconductive particles and the spherical electroconductive particles in the electroconductive adhesive layer being 70 to 80% by weight, the weight ratio of the flaky electroconductive particles to the spherical electroconductive particles, [flaky electroconductive particles]/[spherical electroconductive particles], being 6/4 to 8/2, the thickness of the electroconductive adhesive layer being 5 to 20 μm.

In the shielded printed wiring board of the present invention, the electroconductive particles include the flaky electroconductive particles and the spherical electroconductive particles.

Since the flaky electroconductive particles have sufficient flexibility, in folding the shielded printed wiring board repeatedly, the flaky electroconductive particles can also follow the shielded printed wiring board and be bent, and the flaky electroconductive particles are hardly displaced. Consequently, the contact between the electroconductive particles can be fully maintained, and an increase in the electrical resistance value can be prevented.

When the spherical electroconductive particles are contained, the spherical electroconductive particles are inserted between the flaky electroconductive particles in the thickness direction of the electroconductive adhesive layer, and a large amount of the adhesive resin composition exists between the flaky electroconductive particles. Therefore, the mechanical strength of the electroconductive adhesive layer is improved, and the peel strength increases.

Spherical electroconductive particles are between the flaky electroconductive particles, and the flaky electroconductive particles are electrically connected through the spherical electroconductive particles. Therefore, the shielding properties of the electroconductive adhesive layer are improved.

In the shielded printed wiring board of the present invention, the average particle size of the spherical electroconductive particles is 1 to 10 μm.

If the average particle size of spherical electroconductive particles is less than 1 μm, the spherical electroconductive particles hardly function as three-dimensional obstacles, and the flaky electroconductive particles are easily exposed on the surface of the electroconductive adhesive layer. Consequently, the peel strength of the electroconductive adhesive layer decreases.

If the average particle size of the spherical electroconductive particles exceeds 10 μm, the electroconductivity of the electroconductive adhesive layer decreases, and the shielding properties decrease.

In the shielded printed wiring board of the present invention, the content of the flaky electroconductive particles and the spherical electroconductive particles in the electroconductive adhesive layer is 70 to 80% by weight.

If the content of the flaky electroconductive particles and the spherical electroconductive particles in the electroconductive adhesive layer is less than 70% by weight, there are few electroconductive particles, and the spherical electroconductive particles are therefore hardly inserted between the flaky electroconductive particles. Consequently, the flaky electroconductive particles are hardly electrically connected through the spherical electroconductive particles, and the shielding properties decrease.

If the content of the flaky electroconductive particles and the spherical electroconductive particles in the electroconductive adhesive layer exceeds 80% by weight, the content of the adhesive resin composition relatively decreases. Since the peel strength of the electroconductive adhesive layer depends on the content of the adhesive resin composition, the peel strength of the electroconductive adhesive layer decreases.

In the shielded printed wiring board of the present invention, the weight ratio of the flaky electroconductive particles to the spherical electroconductive particles, [flaky electroconductive particles]/[spherical electroconductive particles], is 6/4 to 8/2.

When the weight ratio of the flaky electroconductive particles to the spherical electroconductive particles, [flaky electroconductive particles]/[spherical electroconductive particles], is less than 6/4, the rate of the spherical electroconductive particles is too high, in flexing the electromagnetic wave shielding film, the electroconductive particles are easily displaced, and the electroconductivity of the electroconductive adhesive layer decreases. Consequently, the shielding properties of the electroconductive adhesive layer decrease.

When the weight ratio of the flaky electroconductive particles to the spherical electroconductive particles, [flaky electroconductive particles]/[spherical electroconductive particles], exceeds 8/2, the flaky electroconductive particles are easily exposed to the surface of the electroconductive adhesive layer, and the peel strength of the electroconductive adhesive layer decreases.

In the shielded printed wiring board of the present invention, the thickness of the electroconductive adhesive layer is 5 to 20 μm, and preferably 8 to 15 μm.

If the thickness of the electroconductive adhesive layer is less than 5 μm, the filling amount of the electroconductive particles increases to secure high shielding performance, and the flexibility and the peel strength cannot be maintained.

When the thickness of the electroconductive adhesive layer exceeds 20 μm, a design for high shielding performance is facilitated, but the electromagnetic wave shielding film cannot be thinned, and the shielded printed wiring board becomes large.

In the shielded printed wiring board of the present invention, the printed circuit includes a ground circuit, the coverlay has an opening formed therein for exposing the ground circuit, and the electroconductive adhesive layer may fill the opening and be in contact with the ground circuit.

With such a configuration, the electroconductive adhesive layer is electrically connected to the ground circuit. Therefore, a satisfactory grounding effect can be obtained.

Because the electroconductive adhesive layer has the configuration described above, even when there is such an opening, the electroconductive adhesive layer can therefore follow the shape of the opening and fill the opening. Therefore, a gap is hardly formed in the opening.

In the shielded printed wiring board of the present invention, an insulating layer may be arranged on the side of the electroconductive adhesive layer not in contact with the coverlay.

The electroconductive adhesive layer can be insulated from the outside by the insulating layer.

In the shielded printed wiring board of the present invention, a metal layer is preferably arranged between the electroconductive adhesive layer and the insulating layer.

When the metal layer is thus arranged, the electromagnetic wave shielding effect is improved.

Advantageous Effects of Invention

In the electromagnetic wave shielding film of the present invention, electroconductive particles include flaky electroconductive particles and spherical electroconductive particles, the average particle size of the spherical electroconductive particles, the content of the flaky electroconductive particles and the spherical electroconductive particles in an electroconductive adhesive layer, the weight ratio of the flaky electroconductive particles to the spherical electroconductive particles, and the thickness of the electroconductive adhesive layer are limited to predetermined values.

Therefore, the electromagnetic wave shielding film of the present invention can be thinned, and has high peel strength, electroconductivity, shielding properties, and flex resistance and conformability to a step.

DESCRIPTION OF EMBODIMENTS

Hereinafter, an electromagnetic wave shielding film and a shielded printed wiring board of the present invention will be described specifically. However, the present invention is not limited to the following embodiments, and the present invention can be appropriately modified and applied as long as the gist of the present invention is not changed.

First Embodiment

Figure 1:
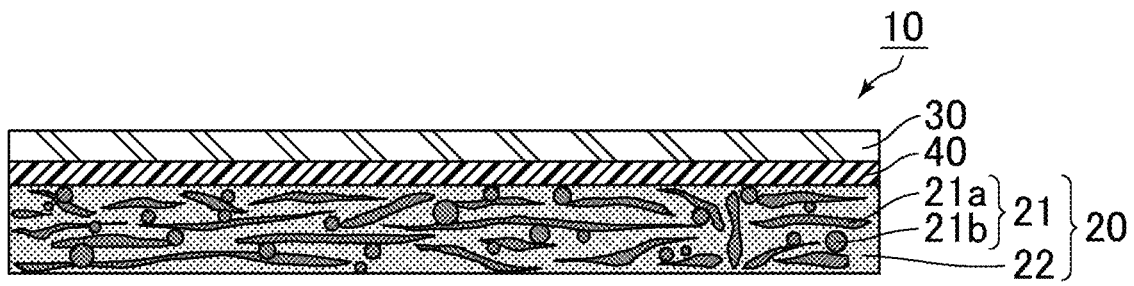
FIG. 1 is a cross-sectional view schematically showing an example of an electromagnetic wave shielding film according to a first embodiment of the present invention.

FIG. 1 is a cross-sectional view schematically showing an example of an electromagnetic wave shielding film according to a first embodiment of the present invention.

As shown in FIG. 1, an electromagnetic wave shielding film 10 includes an electroconductive adhesive layer 20 containing electroconductive particles 21 and an adhesive resin composition 22, an insulating layer 30 layered on the electroconductive adhesive layer 20, and a metal layer 40 arranged between the electroconductive adhesive layer 20 and the insulating layer 30.

The electroconductive particles 21 contain flaky electroconductive particles 21a and spherical electroconductive particles 21b.

Since the flaky electroconductive particles 21a have sufficient flexibility, in folding the electromagnetic wave shielding film 10 repeatedly, the flaky electroconductive particles 21a can also follow the electromagnetic wave shielding film 10 and be bent, and the flaky electroconductive particles 21a are hardly displaced. Consequently, the contact between the electroconductive particles 21 can be fully maintained, and an increase in the electrical resistance value can be prevented.

When the spherical electroconductive particles 21b are contained, the spherical electroconductive particles 21b are inserted between the flaky electroconductive particles 21a in the thickness direction of the electroconductive adhesive layer 20, and a large amount of the adhesive resin composition exists between the flaky electroconductive particles 21a. Therefore, the mechanical strength of the electroconductive adhesive layer 20 is improved, and the peel strength increases.

The spherical electroconductive particles 21b are between the flaky electroconductive particles 21a, and the flaky electroconductive particles 21a are electrically connected through the spherical electroconductive particles 21b. Therefore, the shielding properties of the electroconductive adhesive layer 20 are improved.

In the electromagnetic wave shielding film 10, the average particle size of the flaky electroconductive particles 21a is preferably 0.5 to 30 μm, more preferably 1 to 10 μm.

If the average particle size of the flaky electroconductive particles 21a is in this range, the flaky electroconductive particles 21a have moderate sizes and strengths.

Therefore, the electroconductivity and the flex resistance of the electroconductive adhesive layer are improved. Accordingly, the electroconductive adhesive layer can be thinned.

That is, the electroconductive adhesive layer can be thinned while the electroconductivity and the flex resistance of the electroconductive adhesive layer are maintained.

In the electromagnetic wave shielding film 10, the average aspect ratio of the flaky electroconductive particles 21a is preferably 18 to 150, more preferably 20 to 100, further preferably 20 to 50 in the cut surface of the electroconductive adhesive layer 20 after the electromagnetic wave shielding film 10 is heated and pressurized under the conditions of 150° C., 2 MPa, and 30 minutes.

If the average aspect ratio of the flaky electroconductive particles 21a is 18 or more, the flaky electroconductive particles 21a have sufficient flexibility. In folding the electromagnetic wave shielding film 10 repeatedly, the flaky electroconductive particles 21a can therefore also follow the electromagnetic wave shielding film 10 and be bent, and the flaky electroconductive particles 21a are hardly displaced and damaged. Consequently, an increase in the electrical resistance value can be prevented. The adhesion of the shielding film is also improved.

If the average aspect ratio of the flaky electroconductive particles 21a is 150 or less, such an average aspect ratio is preferable in that the electrical continuity in the thickness direction easily occurs from the viewpoint of the number of the electroconductive particles. Therefore the shielding properties are satisfactory.

In the electromagnetic wave shielding film 10, the average particle size of the spherical electroconductive particles 21b is 1 to 10 μm.

If the average particle size of the spherical electroconductive particles is less than 1 μm, the spherical electroconductive particles hardly function as three-dimensional obstacles, and the flaky electroconductive particles are easily exposed to the surface of the electroconductive adhesive layer. Consequently, the peel strength of the electroconductive adhesive layer decreases.

If the average particle sizes of spherical electroconductive particles exceeds 10 μm, the electroconductivity of the electroconductive adhesive layer decreases, and the shielding properties decrease.

The content of the flaky electroconductive particles 21a and the spherical electroconductive particles 21b in the electroconductive adhesive layer 20 is 70 to 80% by weight.

If the content of the flaky electroconductive particles and the spherical electroconductive particles in the electroconductive adhesive layer is less than 70% by weight, there are few electroconductive particles, the spherical electroconductive particles are hardly therefore inserted between the flaky electroconductive particles. Consequently, the flaky electroconductive particles are hardly electrically connected through the spherical electroconductive particles, and the shielding properties of the electromagnetic wave shielding film decrease.

If the content of the flaky electroconductive particles and the spherical electroconductive particles in the electroconductive adhesive layer exceeds 80% by weight, the content of the adhesive resin composition relatively decreases. Since the peel strength of the electroconductive adhesive layer depends on the content of the adhesive resin composition, the peel strength of the electroconductive adhesive layer decreases.

The weight ratio of the flaky electroconductive particles 21a to the spherical electroconductive particles 21b, [flaky electroconductive particles]/[spherical electroconductive particles], is 6/4 to 8/2.

If the weight ratio of the flaky electroconductive particles to the spherical electroconductive particles, [flaky electroconductive particles]/[spherical electroconductive particles], is less than 6/4, the rate of the spherical electroconductive particles is too high. In flexing the electromagnetic wave shielding film, the electroconductive particles are easily displaced, and the electroconductivity of the electroconductive adhesive layer decreases. Consequently, the shielding properties of the electroconductive adhesive layer decrease.

If the weight ratio of the flaky electroconductive particles to the spherical electroconductive particles, [flaky electroconductive particles]/[spherical electroconductive particles], exceeds 8/2, the flaky electroconductive particles are easily exposed to the surface of the electroconductive adhesive layer, and the peel strength of the electroconductive adhesive layer decreases.

The flaky electroconductive particles 21a and the spherical electroconductive particles 21b desirably contain a metal such as silver, copper, nickel, aluminum, or silver-coated copper, which is copper plated with silver.

The flaky electroconductive particles 21a and the spherical electroconductive particles 21b may be constituted of the same material, or may be constituted of different materials.

Examples of the method for producing the spherical electroconductive particles 21b include atomization, involving jetting raw material particles from a nozzle and regulating the gas pressure and the like.

The shapes of the spherical electroconductive particles 21b can be controlled by regulating the gas pressure and the like. Spherical electroconductive particles 21b in the form of a perfect sphere or distorted spheres can be produced.

When the spherical electroconductive particles 21b are produced by the atomization, the aspect ratio of the spherical electroconductive particles 21b can be approximated to 1.

Although the material of the adhesive resin composition 22 is not limited, as the material, a thermoplastic resin composition such as a styrene-based resin composition, a vinyl acetate-based resin composition, a polyester-based resin composition, a polyethylene-based resin composition, a polypropylene-based resin composition, an imide-based resin composition, an amide-based resin composition, or an acryl-based resin composition; a thermosetting resin composition such as a phenol-based resin composition, an epoxy-based resin composition, a urethane-based resin composition, a melamine-based resin composition, or an alkyd-based resin composition; or the like can be used.

The material of the adhesive resin composition may be alone or a combination of two or more.

In the electromagnetic wave shielding film 10, the ratio of the area of the adhesive resin composition 22 to the total area of the cut surface is preferably 60 to 95% in the cut surface of the electroconductive adhesive layer 20 after the electromagnetic wave shielding film 10 is heated and pressurized under the conditions of 150° C., 2 MPa, and 30 minutes.

If this area ratio is less than 60%, the rate of electroconductive particles 21 relatively increases, and electroconductive particles 21 are crowded, and the flexibility of the electroconductive adhesive layer 20 decreases. Consequently, the step conformability decreases.

If this area ratio exceeds 95%, the contact points between the electroconductive particles 21 decrease, the electroconductivity decreases. Consequently, the shielding properties decrease.

The expression "ratio of the area of the adhesive resin composition to the total area of the cut surface" used herein means the rate of the area of the adhesive resin composition deduced from an SEM image of a cross section obtained by cutting the electromagnetic wave shielding film.

The specific calculation method is as follows.

The cut surface of the electroconductive adhesive layer is observed using a scanning electron microscope (SEM).

When the cut surface is observed with the SEM from the vertical direction, a contrast difference between the adhesive resin composition and the electroconductive particles is made, and the shapes of the electroconductive particles can be recognized.

In The SEM image of the cross section obtained by cutting the electromagnetic wave shielding film, the portions of the adhesive resin composition and the portions of the electroconductive particles are binarized into black and white using image analysis software "GIMP 2.10.6".

Then, the numbers of black and white pixels are counted to calculate the rate of the area of the adhesive resin composition from the ratio between the numbers of the pixels.

In the electromagnetic wave shielding film 10, the distance between flaky electroconductive particles is preferably 1.5 μm or more, more preferably 2 μm or more, further preferably 4 μm or more in the cut surface of electroconductive adhesive layer 20 after the electromagnetic wave shielding film 10 is heated and pressurized under conditions of 150° C., 2 MPa, and 30 minutes. The distance is preferably 9 μm or less, more preferably 8 μm or less, further preferably 6 μm or less.

If the distance between the flaky electroconductive particles is 1.5 μm or more, the peel strength increases.

If the distance between the flaky electroconductive particles is 9 μm or less, the shielding properties are improved.

The distance between the flaky electroconductive particles can be measured by the following method.

The cut surface of the electroconductive adhesive layer is observed using a scanning electron microscope (SEM).

Then, 10 pairs of adjacent flaky electroconductive particles per image are selected. Then, the distance between each pair of adjacent flaky electroconductive particles in the thickness direction is measured. The values thereof are averaged, and the average value is defined as the distance between the adjacent flaky electroconductive particles.

In the electromagnetic wave shielding film 10, the thickness of the electroconductive adhesive layer 20 is 5 to 20 μm, and more preferably 8 to 15 μm.

If the thickness of the electroconductive adhesive layer is less than 5 μm, the filling amount of the electroconductive particles increases to secure high shielding performance, and the flexibility and the peel strength cannot be maintained.

If the thickness of the electroconductive adhesive layer exceeds 20 μm, a design for an increase of high shielding performance is facilitated, but the electromagnetic wave shielding film cannot be thinned.

The electroconductive adhesive layer 20 may further contain a flame retardant, an auxiliary flame retardant, a curing accelerator, a tackifier, an antioxidant, a pigment, a dye, a plasticizer, an ultraviolet absorber, an antifoaming agent, a leveling agent, a filler, a viscosity modifier, and the like.

As shown in FIG. 1, the electromagnetic wave shielding film 10 includes the insulating layer 30. Therefore, the handleability is improved. The electroconductive adhesive layer 20 can be insulated from the outside.

The insulating layer 30 is not limited as long as the insulating layer 30 of the electromagnetic wave shielding film 10 has adequate insulating properties, and can protect the electroconductive adhesive layer 20 and the metal layer 40. For example, the insulating layer 30 is desirably constituted of a thermoplastic resin composition, a thermosetting resin composition, an active energy ray curable composition, or the like.

Examples of the above-mentioned thermoplastic resin composition include, but are not limited to, styrene-based resin compositions, vinyl acetate-based resin compositions, polyester-based resin compositions, polyethylene-based resin compositions, polypropylene-based resin compositions, imide-based resin compositions, and acryl-based resin compositions.

Examples of the above-mentioned thermosetting resin compositions include, but are not limited to, phenol-based resin compositions, epoxy-based resin compositions, urethane-based resin compositions, melamine-based resin compositions, and alkyd-based resin compositions.

Examples of the above-mentioned active energy ray curable composition include, but are not limited to, polymerizable compounds having at least two (meth)acryloyloxy groups in a molecule.

The insulating layer 30 may be constituted of only one material and may be constituted of two or more materials.

The insulating layer 30 may contain a curing accelerator, a tackifier, an antioxidant, a pigment, a dye, a plasticizer, an ultraviolet absorber, an antifoaming agent, a leveling agent, a filler, a flame retardant, a viscosity modifier, an antiblocking agent, and the like as needed.

The thickness of the insulating layer 30 is not limited, and can be appropriately set as needed, but the thickness is desirably 1 to 15 μm, more desirably 3 to 10 μm.

As shown in FIG. 1, the electromagnetic wave shielding film 10 includes the metal layer 40. Therefore, the electromagnetic wave shielding effect is improved.

The metal layer 40 may include a layer containing a material such as gold, silver, copper, aluminum, nickel, tin, palladium, chromium, titanium, or zinc, and desirably includes a copper layer.

Copper is a material suitable for the metal layer 40 from the viewpoint of electroconductivity and economical efficiency.

The metal layer 40 may include a layer containing an alloy of the above-mentioned metals.

The thickness of the metal layer 40 is desirably 0.01 to 10 µm.

If the thickness of the metal layer is less than 0.01 µm, a sufficient shielding effect is hardly obtained.

If the thickness of the metal layer exceeds 10 µm, the electromagnetic wave shielding film is hardly flexed.

In electromagnetic wave shielding film 10, an anchor coat layer may be formed between the insulating layer 30 and the metal layer 40.

Examples of the material of the anchor coat layer include a urethane resin, an acryl resin, a core-shell type composite resin having a urethane resin as shells and having an acryl resin as cores, an epoxy resin, an imide resin, an amide resin, a melamine resin, a phenol resin, a urea-formaldehyde resin, a blocked isocyanate obtained by reacting a blocking agent such as phenol with a polyisocyanate, polyvinyl alcohol, and polyvinylpyrrolidone.

Next, the method for manufacturing a shielded printed wiring board using the electromagnetic wave shielding film according to the first embodiment of the present invention will be described.

Figure 2:
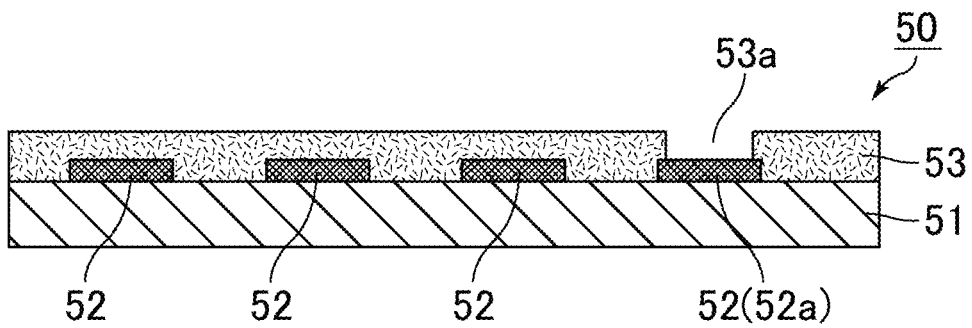
FIG. 2 is a cross-sectional view schematically showing a printed wiring board provision step in a method for manufacturing a shielded printed wiring board using the electromagnetic wave shielding film according to the first embodiment of the present invention.

FIG. 2 is a cross-sectional view schematically showing a printed wiring board provision step in the method for manufacturing the shielded printed wiring board using the electromagnetic wave shielding film according to the first embodiment of the present invention.

Figure 3:
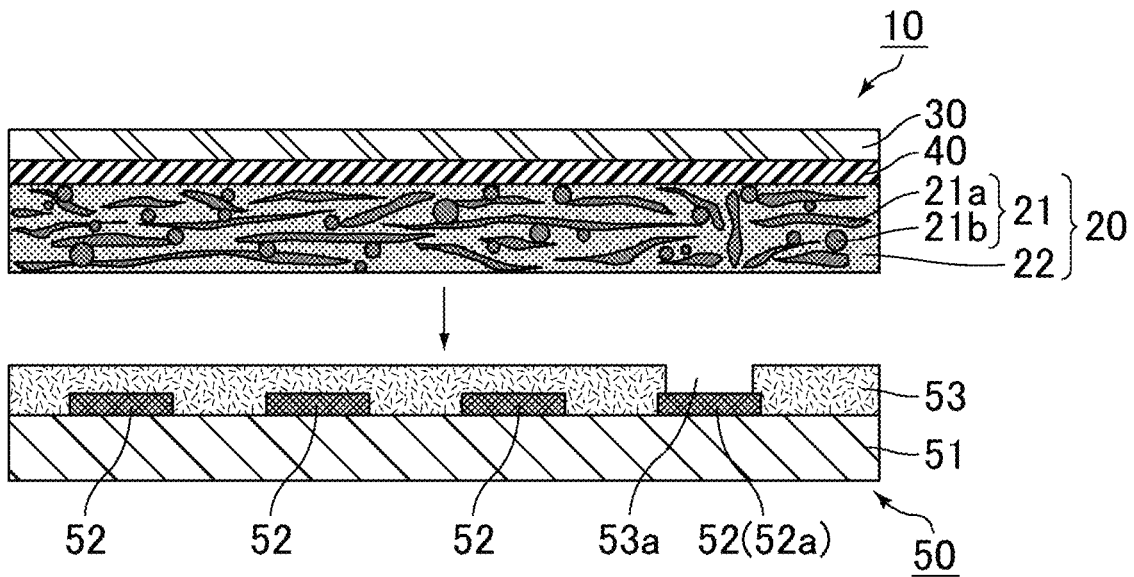
FIG. 3 is a cross-sectional view schematically showing an electromagnetic wave shielding film pasting step in the method for manufacturing a shielded printed wiring board using the electromagnetic wave shielding film according to the first embodiment of the present invention.

FIG. 3 is a cross-sectional view schematically showing an electromagnetic wave shielding film pasting step in the method for manufacturing the shielded printed wiring board using the electromagnetic wave shielding film according to the first embodiment of the present invention.

Figure 4:
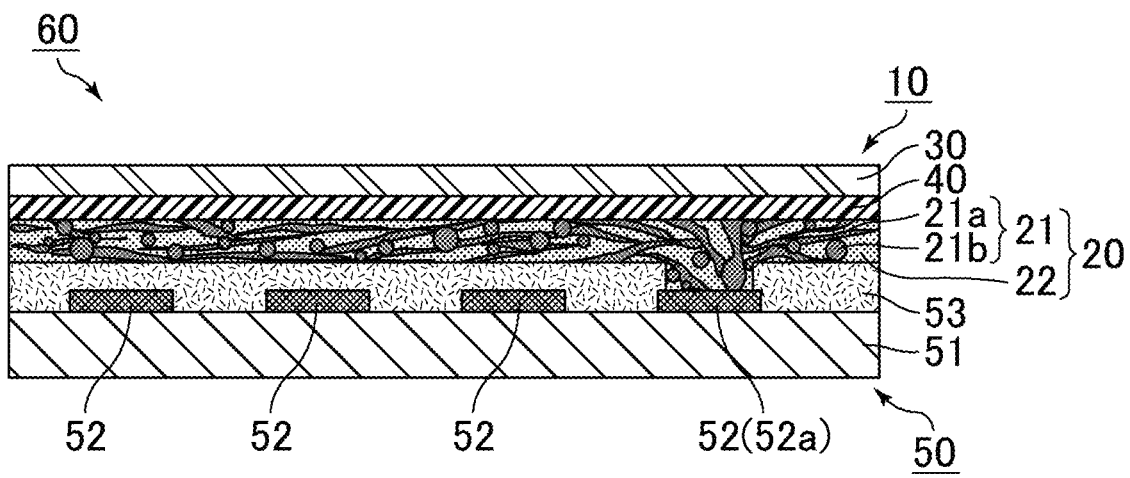
FIG. 4 is a cross-sectional view schematically showing a heating and pressurization step in a method for manufacturing a shielded printed wiring board using the electromagnetic wave shielding film according to the first embodiment of the present invention.

FIG. 4 is a cross-sectional view schematically showing a heating and pressurization step in the method for manufacturing the shielded printed wiring board using the electromagnetic wave shielding film according to the first embodiment of the present invention.

(1) Printed Wiring Board Provision Step

As shown in FIG. 2, a printed wiring board 50 including a base film 51, a printed circuit 52 arranged on the base film 51, and a coverlay 53 arranged so as to cover the printed circuit 52 is first provided.

In the printed wiring board 50, the printed circuit 52 includes a ground circuit 52a, and an opening 53a for exposing the ground circuit 52a is formed in the coverlay 53.

The materials of the base film 51 and the coverlay 53 are not limited, but desirably contain an engineering plastic. Examples of such an engineering plastic include resins such as polyethylene terephthalate, polypropylene, crosslinked polyethylene, polyesters, polybenzimidazole, polyimides, polyimide amides, polyetherimides, and polyphenylene sulfide.

When flame retardance is required, among these engineering plastics, a polyphenylene sulfide film is desirable. When heat resistance is required, a polyimide film is desirable. The thickness of the base film 51 is desirably 10 to 40 µm. The thickness of the coverlay 53 is desirably 10 to 30 µm.

The printed circuit 52 is not limited, but can be formed by subjecting an electroconductive material to etching treatment.

Examples of the electroconductive material include copper, nickel, silver, and gold.

(2) Electromagnetic Wave Shielding Film Pasting Step

As shown in FIG. 3, an electromagnetic wave shielding film 10 is then provided, and the electromagnetic wave shielding film 10 is arranged on the printed wiring board 50 such that the electroconductive adhesive layer 20 is in contact with the coverlay 53.

(3) Heating and Pressurization Step

As shown in FIG. 4, the electromagnetic wave shielding film 10 is then heated and pressurized, and is pasted on the printed wiring board 50.

The heating and pressurization conditions are desirably 150° C. to 200° C., 2 to 5 MPa, and 1 to 10 minutes.

The electroconductive adhesive layer 20 fills the opening 53a by the heating and pressurization step.

A shielded printed wiring board 60 can be manufactured through the above-mentioned steps.

The shielded printed wiring board 60 is also an aspect of the shielded printed wiring board of the present invention.

In the shielded printed wiring board 60, the electroconductive adhesive layer 20 of the electromagnetic wave shielding film 10 contains flaky electroconductive particles 21a and spherical electroconductive particles 21b.

Since the flaky electroconductive particles 21a have sufficient flexibility, in folding the shielded printed wiring board 60 repeatedly, the flaky electroconductive particles 21a can also follow and be bent, and the flaky electroconductive particles 21a are hardly displaced. Consequently, the contact between the electroconductive particles 21 can be fully maintained, and an increase in the electrical resistance value can be prevented.

When the spherical electroconductive particles 21b are contained, the spherical electroconductive particles 21b are inserted between the flaky electroconductive particles 21a in the thickness direction of electroconductive adhesive layer 20, and a large amount of the adhesive resin composition exists between the flaky electroconductive particles 21a. Therefore, the mechanical strength of the electroconductive adhesive layer 20 is improved, and the peel strength increases.

The spherical electroconductive particles 21b are between the flaky electroconductive particles 21a, and the flaky electroconductive particles 21a are electrically connected through the spherical electroconductive particles 21b. Therefore, the shielding properties of electroconductive adhesive layer 20 are improved.

In the shielded printed wiring board 60, the average particle size of the spherical electroconductive particles 21b is 1 to 10 µm.

If the average particle size of the spherical electroconductive particles is less than 1 µm, the spherical electroconductive particles hardly function as three-dimensional obstacles, and the flaky electroconductive particles are easily exposed on the surface of the electroconductive adhesive layer. Consequently, the peel strength of the electroconductive adhesive layer decreases.

If the average particle size of the spherical electroconductive particles exceeds 10 µm, the electroconductivity of the electroconductive adhesive layer decreases, and the shielding properties decrease.

In the shielded printed wiring board 60, the content of the flaky electroconductive particles 21a and the spherical electroconductive particles 21b in the electroconductive adhesive layer 20 is 70 to 80% by weight.

If the content of the flaky electroconductive particles and the spherical electroconductive particles in the electroconductive adhesive layer is less than 70% by weight, there are few electroconductive particles, the spherical electroconductive particles are hardly therefore inserted between the flaky electroconductive particles. Consequently, the flaky electroconductive particles are hardly electrically connected through the spherical electroconductive particles, and the shielding properties of the electromagnetic wave shielding film decrease.

If the content of the flaky electroconductive particles and the spherical electroconductive particles in the electroconductive adhesive layer exceeds 80% by weight, the content of the adhesive resin composition relatively decreases. Since the peel strength of the electroconductive adhesive layer depends on the content of the adhesive resin composition, the peel strength of the electroconductive adhesive layer decreases.

In the shielded printed wiring board 60, the weight ratio of the flaky electroconductive particles 21*a* to the spherical electroconductive particles 21*b*, [flaky electroconductive particles]/[spherical electroconductive particles], is 6/4 to 8/2.

If the weight ratio of the flaky electroconductive particles to the spherical electroconductive particles, [flaky electroconductive particles]/[spherical electroconductive particles], is less than 6/4, the rate of the spherical electroconductive particles is too high, and an area in which flaky electroconductive particles are overlapped decreases. When a large amount of spherical electroconductive particles exist between the flaky electroconductive particles, the intervals between the flaky electroconductive particles increase, and the electroconductivity (shielding properties) decreases. In flexing the electromagnetic wave shielding film, the connection between the electroconductive particles is furthermore deteriorated.

If the weight ratio of the flaky electroconductive particles to the spherical electroconductive particles, [flaky electroconductive particles]/[spherical electroconductive particles], exceeds 8/2, an area in which the flaky electroconductive particles are overlapped increases, and the shielding performance is improved, but the intervals between the flaky electroconductive particles are short, and the peel strength of the electroconductive adhesive layer decreases, and this results in peeling the electromagnetic wave shielding film off the shielded printed wiring board.

In the shielded printed wiring board 60, the thickness of the electroconductive adhesive layer 20 is 5 to 20 μm, and preferably 8 to 15 μm.

If the thickness of the electroconductive adhesive layer is less than 5 μm, the filling amount of electroconductive particles increases to secure high shielding performance, and the flexibility and the peel strength cannot be maintained.

If the thickness of the electroconductive adhesive layer exceeds 20 μm, a design for an increase in high shielding is facilitated, but the electromagnetic wave shielding film cannot be thinned, and the shielded printed wiring board becomes large.

Second Embodiment

Next, an electromagnetic wave shielding film according to a second embodiment of the present invention will be described.

Figure 5:
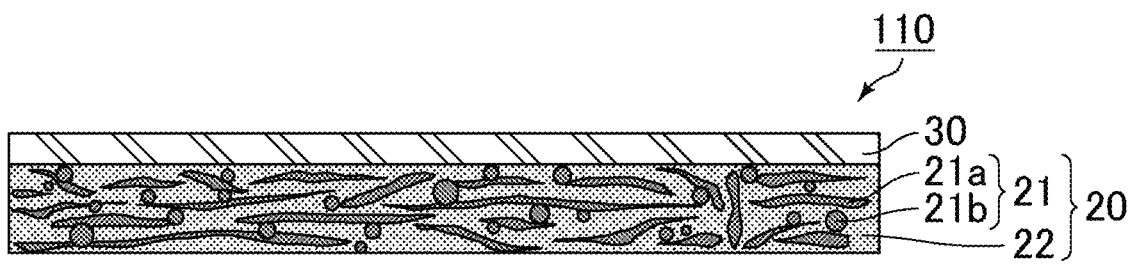
FIG. 5 is a cross-sectional view schematically showing an example of an electromagnetic wave shielding film according to a second embodiment of the present invention.

FIG. 5 is a cross-sectional view schematically showing an example of an electromagnetic wave shielding film according to a second embodiment of the present invention.

An electromagnetic wave shielding film 110 shown in FIG. 5 has the same configuration as the above-mentioned electromagnetic wave shielding film 10 according to the first embodiment of the present invention except that the metal layer 40 is not arranged.

That is, the electromagnetic wave shielding film 110 includes an electroconductive adhesive layer 20 containing electroconductive particles 21 containing flaky electroconductive particles 21*a* and spherical electroconductive particles 21*b* and an adhesive resin composition 22 and an insulating layer 30 layered on the electroconductive adhesive layer 20.

A desirable configuration of the electroconductive adhesive layer 20, the flaky electroconductive particles 21*a* and the spherical electroconductive particles 21*b*, the adhesive resin composition 22, and the insulating layer 30 in the electromagnetic wave shielding film 110 is the same as the desirable configuration of the electroconductive adhesive layer 20, the flaky electroconductive particles 21*a* and the spherical electroconductive particles 21*b*, the adhesive resin composition 22, and the insulating layer 30 in the above-mentioned electromagnetic wave shielding film 110.

Even with such a configuration, the electromagnetic wave shielding film 110 can be thinned, and has high peel strength, and electroconductivity, shielding properties, and flex resistance and conformability to the step.

EXAMPLES

Hereinafter, the Examples for describing the present invention more specifically will be shown, but the present invention is not limited to these Examples.

Example 1

An epoxy resin was applied to a transfer film and heated at 100° C. for 2 minutes using an electric oven, and an insulating layer having a thickness of 5 μm was produced.

Then, flaky electroconductive particles and spherical electroconductive particles, and an adhesive resin composition (epoxy-cresol novolac resin: produced by DIC Corporation "EPICLON N-655-EXP") described in Table 1 were provided. These were mixed so that the blended amounts thereof were blended amounts described in Table 1. An electroconductive resin composition was produced. The average particle sizes of the flaky electroconductive particle powder and the spherical electroconductive particles were measured by laser diffractive scattering particle size distribution measurement using an MT3300EXII manufactured by MicrotracBEL Corp.

Then, the electroconductive resin composition was applied onto the insulating layer to form an electroconductive adhesive layer having a thickness of 15 μm, and an electromagnetic wave shielding film according to Example 1 was produced.

Examples 2 to 9 and Comparative Examples 1 to 15

Electromagnetic wave shielding films according to Examples 2 to 9 and Comparative Examples 1 to 15 were produced in the same way as in Example 1 except that the types, blending rates, and contents of the flaky electroconductive particles and the spherical electroconductive particles, and the thickness of the electroconductive adhesive layer were changed as shown in Table 1 and Table 2.

TABLE 1

|  |  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| Flaky electro-conductive particles | Material | Silver-coated copper powder | Silver-coated copper powder | Silver-coated copper powder | Silver-coated copper powder | Silver-coated copper powder | Silver-coated copper powder | Silver-coated copper powder | Silver-coated copper powder | Silver-coated copper powder |
|  | Average particle size (μm) | 6 | 6 | 6 | 6 | 6 | 6 | 6 | 6 | 6 |
|  | Aspect ratio | 26.5 | 26.5 | 26.5 | 26.5 | 26.5 | 26.5 | 26.5 | 26.5 | 26.5 |
|  | Weight rate in electroconductive particles | 70% | 70% | 70% | 70% | 70% | 70% | 70% | 60% | 80% |
| Spherical electro-conductive particles | Material | Silver-coated copper powder | Silver-coated copper powder | Silver-coated copper powder | Silver-coated copper powder | Silver-coated copper powder | Silver-coated copper powder | Silver-coated copper powder | Silver-coated copper powder | Silver-coated copper powder |
|  | Average particle size (μm) | 1 | 2 | 3 | 5 | 8 | 6 | 6 | 5 | 5 |
|  | Aspect ratio | 1.3 | 1.2 | 1.4 | 1.2 | 1.1 | 1.6 | 1.6 | 1.2 | 1.2 |
|  | Weight rate in electroconductive particles | 30% | 30% | 30% | 30% | 30% | 30% | 30% | 40% | 20% |
| Content of electroconductive particles |  | 70% by weight | 70% by weight | 70% by weight | 70% by weight | 70% by weight | 77% by weight | 77% by weight | 70% by weight | 70% by weight |
| Thickness of electroconductive adhesive layer (μm) |  | 15 | 15 | 15 | 15 | 15 | 10 | 15 | 15 | 15 |
| Evaluation results | Peel strength (N/cm) | 3.1 | 3.7 | 4.0 | 4.2 | 4.4 | 3.5 | 3.3 | 5.3 | 3.1 |
|  | Resistance value (mΩ) | 22 | 23 | 44 | 50 | 62 | 40 | 20 | 58 | 19 |
|  | Shielding properties (dB) | 78 | 77 | 75 | 74 | 70 | 73 | 80 | 71 | 80 |
|  | Flex resistance and conformability to step (appearance) | Good | Good | Good | Good | Good | Good | Good | Good | Good |
|  | Flex resistance and conformability to step (resistance value mΩ) | 93 | 103 | 115 | 122 | 201 | 137 | 70 | 188 | 67 |
|  | Distance between flaky electroconductive particles (μm) | 1.7 | 1.9 | 3.2 | 5.0 | 6.9 | 5.2 | 5.2 | 5.0 | 5.0 |

TABLE 2

|  |  | Comp. Ex 1 | Comp. Ex. 2 | Comp. Ex. 3 | Comp. Ex. 4 | Comp. Ex. 5 | Comp. Ex. 6 | Comp Ex. 7 | Comp. Ex. 8 |
|---|---|---|---|---|---|---|---|---|---|
| Flaky electroconductive particles | Material | Silver-coated copper powder | Silver-coated copper powder | Silver-coated copper powder | Silver-coated copper powder | Silver-coated copper powder | Silver-coated copper powder | Silver-coated copper powder | Silver-coated copper powder |
|  | Average particle size (μm) | 6 | 6 | 6 | 6 | 6 | 6 | 6 | 6 |
|  | Aspect ratio | 26.5 | 26.5 | 26.5 | 26.5 | 26.5 | 26.5 | 26.5 | 26.5 |
|  | Weight rate in electroconductive particles | 70% | 70% | 70% | 100% | 100% | 40% | 50% | 60% |
| Spherical electroconductive particles | Material | Silver-coated copper powder | Silver-coated copper powder | Silver-coated copper powder | — | — | Silver-coated copper powder | Silver-coated copper powder | Silver-coated copper powder |
|  | Average particle size (μm) | 0.5 | 11 | 13 | — | — | 2 | 2 | 5 |
|  | Aspect ratio | 1.6 | 1.85 | 1 | — | — | 1.2 | 1.2 | 1.2 |
|  | Weight rate in electroconductive particles | 30% | 30% | 30% | 0% | 0% | 60% | 50% | 40% |
| Content of electroconductive particles (by weight) |  | 70% | 70% | 70% | 65% | 85% | 90% | 85% | 65% |
| Thickness of electroconductive adhesive layer (μm) |  | 15 | 15 | 15 | 20 | 8 | 10 | 10 | 15 |
| Evaluation results | Peel strength (N/cm) | 2.7 | 4.7 | 5.1 | 1.9 | 1.0 | 1.7 | 3.1 | 5.3 |
|  | Resistance value (mΩ) | 75 | 89 | 279 | 30 | 16 | 22 | 11 | 110 |
|  | Shielding properties (dB) | 78 | 64 | 55 | 70 | 83 | 86 | 85 | 65 |
|  | Flex resistance and conformability to step (appearance) | Good | Good | Good | Good | Poor | Poor | Poor | Good |
|  | Flex resistance and conformability to step (resistance value mΩ) | 95 | 639 | 22874 | 203 | O.L. | 49 | 53 | 572 |
|  | Distance between flaky electroconductive particles (μm) | 0.4 | 9.8 | 12.8 | — | — | 1.7 | 1.7 | 5.0 |

TABLE 2-continued

| | | Comp. Ex. 9 | Comp. Ex. 10 | Comp. Ex. 11 | Comp. Ex. 12 | Comp Ex. 13 | Comp. Ex. 14 | Comp. Ex. 15 |
|---|---|---|---|---|---|---|---|---|
| Flaky electroconductive particles | Material | Silver-coated copper | Silver-coated copper | Silver-coated copper | Silver-coated copper | Silver-coated copper | Silver-coated copper | Silver-coated copper |
| | Average particle size (μm) | 6 | 6 | 6 | 6 | 6 | 6 | 6 |
| | Aspect ratio | 26.5 | 26.5 | 26.5 | 26.5 | 26.5 | 26.5 | 26.5 |
| | Weight rate in electroconductive particles | 80% | 60% | 80% | 50% | 90% | 50% | 90% |
| Spherical electroconductive particles | Material | Silver-coated copper powder | Silver-coated copper powder | Silver-coated copper powder | Silver-coated copper powder | Silver-coated copper powder | Silver-coated copper powder | Silver-coated copper powder |
| | Average particle size (μm) | 5 | 5 | 5 | 5 | 5 | 5 | 5 |
| | Aspect ratio | 1.2 | 1.2 | 1.2 | 1.2 | 1.2 | 1.2 | 1.2 |
| | Weight rate in electroconductive particles | 20% | 40% | 20% | 50% | 10% | 50% | 10% |
| Content of electroconductive particles (by weight) | | 65% | 85% | 85% | 70% | 70% | 80% | 80% |
| Thickness of electroconductive adhesive layer (μm) | | 15 | 15 | 15 | 15 | 15 | 15 | 15 |
| Evaluation results | Peel strength (N/cm) | 2.7 | 2.3 | 1.9 | 3.3 | 1.5 | 2.9 | 0.5 |
| | Resistance value (mΩ) | 59 | 21 | 20 | 90 | 23 | 75 | 10 |
| | Shielding properties (dB) | 70 | 76 | 80 | 67 | 80 | 78 | 85 |
| | Flex resistance and conformability to step (appearance) | Good | Poor | Poor | Good | Good | Good | Good |
| | Flex resistance and conformability to step (resistance value mΩ) | 235 | 102 | 72 | 511 | 71 | 95 | 40 |
| | Distance between flaky electroconductive particles (μm) | 5.0 | 5.0 | 5.0 | 5.0 | 5.0 | 5.0 | 5.0 |

Heating and Pressurization Test

A polyimide resin plate having a thickness of 25 μm was provided. The electromagnetic wave shielding film according to each of Examples or each of Comparative Examples was arranged such that the electroconductive adhesive layer is contact with the polyimide resin plate.

Then, the electromagnetic wave shielding film according to each of Examples or each of Comparative Examples was heated and pressurized under the conditions of 150° C., 2 MPa, 30 minutes, and pasted on the polyimide resin plate.

The electromagnetic wave shielding film after the heating and pressurization test was cut, and an SEM image was photographed. The particle sizes and the aspect ratios of the electroconductive particles were measured using image processing software (SEM Control User Interface Ver3.10). Table 1 and Table 2 show the results.

The distance between the flaky electroconductive particles was measured with the SEM image. Table 1 and Table 2 show the results.

An SEM image of a cross section of the electromagnetic wave shielding film according to Example 1 is shown as a representative example.

Figure 6:
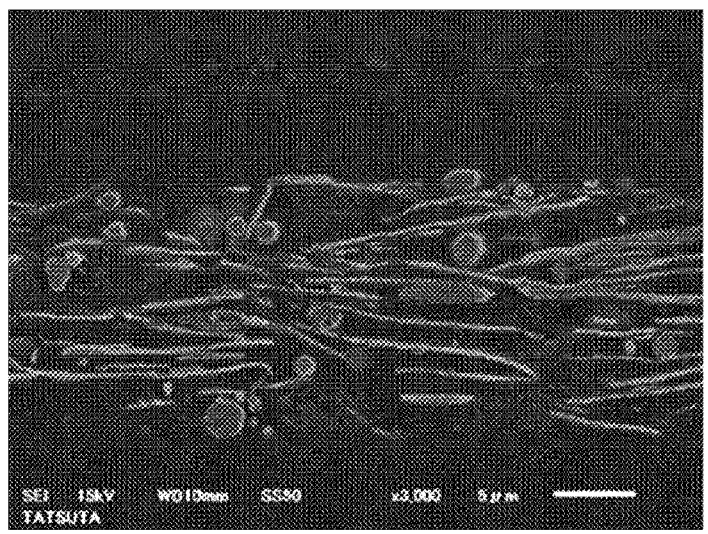
FIG. 6 is an SEM image of a cross section of an electromagnetic wave shielding film according to Example 1.

FIG. 6 is the SEM image of the cross section of the electromagnetic wave shielding film according to Example 1.

The electromagnetic wave shielding film according to each of Examples or each of Comparative Example was pasted on the polyimide resin plate under the same conditions as the above-mentioned heating and pressurization conditions separately, and the peel strength when the electromagnetic wave shielding film was exfoliated from the polyimide resin plate was then measured. Table 1 and Table 2 show the results.

Connection Resistance Value Measurement Test

The electrical resistance value of the electromagnetic wave shielding film according to each Examples or each Comparative Examples was measured by the following method using the electromagnetic wave shielding film according to each of Examples or each of Comparative Examples. Table 1 and Table 2 show the measurement results.

Figure 7A:
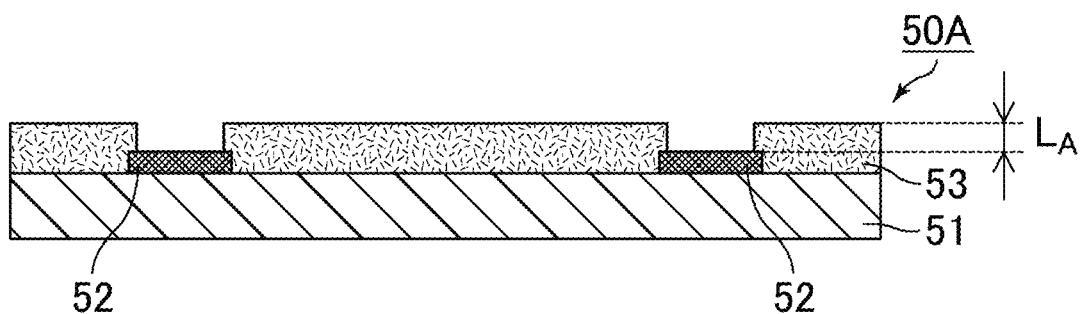
FIG. 7A is a side sectional view schematically showing a method for a connection resistance value measurement test.
Figure 7B:
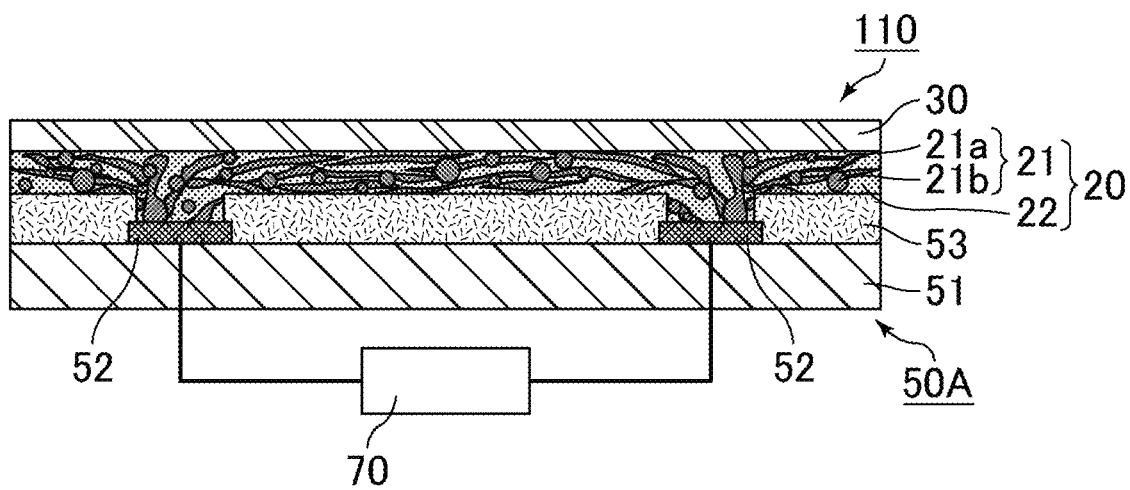
FIG. 7B is a side sectional view schematically showing the method for the connection resistance value measurement test.

FIG. 7A and FIG. 7B are side sectional views schematically showing a method for the connection resistance value measurement test.

As shown in FIG. 7A, a printed wiring board 50A for measuring the connection resistance value in which two printed circuits 52 not connected to each other were formed on a base film 51, and a coverlay 53 covering the base film 51 and the printed circuits 52 was formed was provided. Openings 53a having a diameter of 0.8 mm and a depth (the distance indicated with the reference sign $L_A$ in FIG. 7A) of 27.5 μm for exposing parts of the printed circuits 52 were formed in the coverlay 53.

As shown in FIG. 7B, the electromagnetic wave shielding film 110 is then pasted on the printed wiring board 50A for measuring the connection resistance value such that the electroconductive adhesive layer 20 of the electromagnetic wave shielding film 110 according to each of Examples or each of Comparative Examples was in contact with the coverlay 53. The printed wiring board on which the electromagnetic wave shielding film was pasted was compression bonded with a press under the conditions of temperature: 170° C., time: 30 minutes, and pressure: 3 MPa. The electroconductive adhesive layer 20 enters the openings 53a thereby, the electroconductive adhesive layer 20 and the printed circuits 52 are in contact, and the printed circuits 52 can be electrically connected through the electroconductive adhesive layer 20.

Then, the electrical resistance value between the printed circuits 52 was measured with a resistor 70.

Evaluation of Shielding Properties

The shielding properties of the electromagnetic wave shielding film according to each of Examples or each of Comparative Examples was evaluated by the KEC method using an electromagnetic wave shielding effect measuring apparatus developed by KEC Electronic Industry Development Center.

Figure 8:
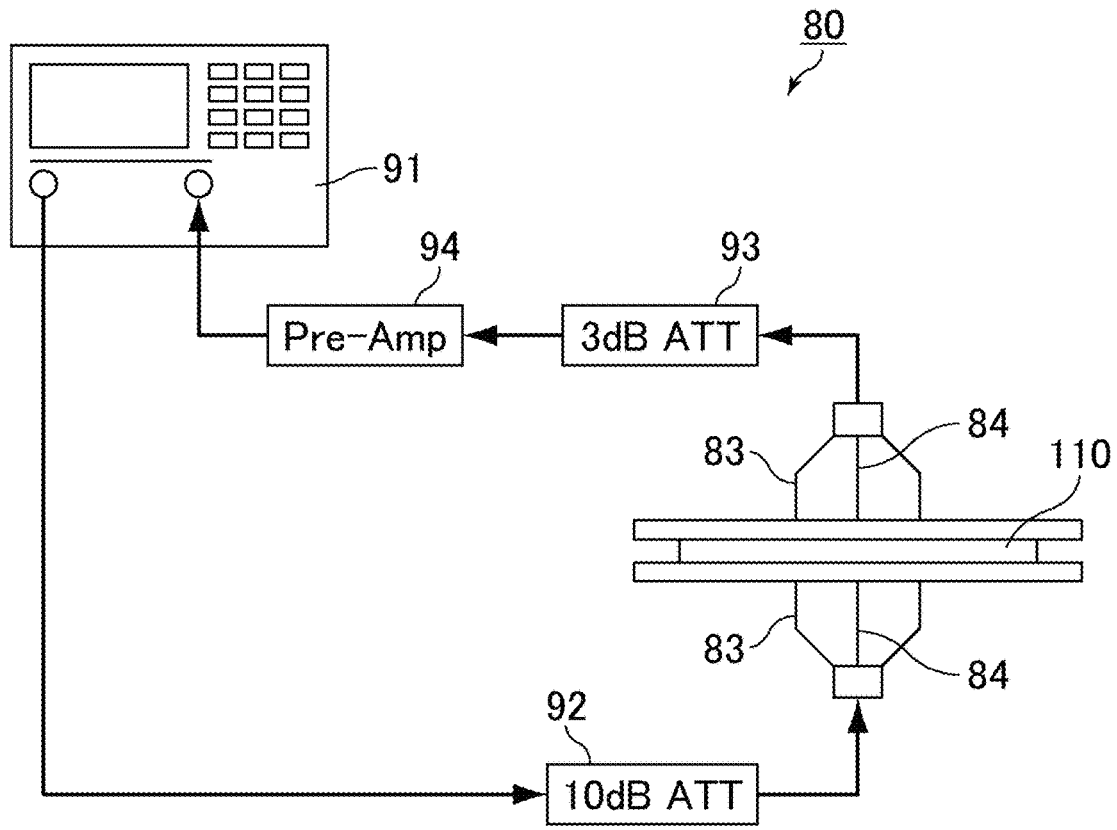
FIG. 8 is a schematic view schematically showing a system configuration used in the KEC method.

FIG. 8 is a schematic view schematically showing a system configuration used in the KEC method.

The system to be used in the KEC method is constituted of an electromagnetic wave shielding effect measuring apparatus 80, a spectrum analyzer 91, an attenuator 92 for damping 10 dB, an attenuator 93 for damping 3 dB, and a preamplifier 94.

As shown in FIG. 8, the electromagnetic wave shielding effect measuring apparatus 80 is provided with two opposed measurement jigs 83. The electromagnetic wave shielding film (indicated with the reference numeral 110 in FIG. 8) according to each of Examples or each of Comparative Examples is installed so that the electromagnetic wave shielding film is clamped between these measurement jigs 83. The dimensional distribution of a TEM cell (Transverse Electro Magnetic Cell) is introduced into the measurement jigs 83, which have a structure symmetrically divided in the plane perpendicular to the transmission axis thereof. However, flat central conductors 84 and the respective measurement jigs 83 are spaced and arranged to prevent the formation of a short circuit by the insertion of the electromagnetic wave shielding film 110.

In the KEC method, a signal output from the spectrum analyzer 91 is first input into the measurement jig 83 on the transmitting side through the attenuator 92. The signal received at the measurement jig 83 on the receiving side and passed through the attenuator 93 is then amplified at the preamplifier 94, and the signal level is measured with the spectrum analyzer 91. The spectrum analyzer 91 outputs attenuation when the electromagnetic wave shielding film 110 is installed in the electromagnetic wave shielding effect measuring apparatus 80 based on a state in which the electromagnetic wave shielding film 110 is not installed in the electromagnetic wave shielding effect measuring apparatus 80.

The electromagnetic wave shielding film according to each of Examples or each of Comparative Examples was cut to a 15-cm square, and the shielding properties at 200 MHz were measured under the conditions of a temperature of 25° C., a relative humidity of 30 to 50% using such an apparatus. Table 1 and Table 2 shows the measurement results.

Evaluation of Flex Resistance and Conformability to Step

The flex resistance and the conformability to the step of the electromagnetic wave shielding film according to each of Examples or each of Comparative Examples were measured by the following method using the electromagnetic wave shielding film according to each of Examples or each of Comparative Examples.

Figure 9A:
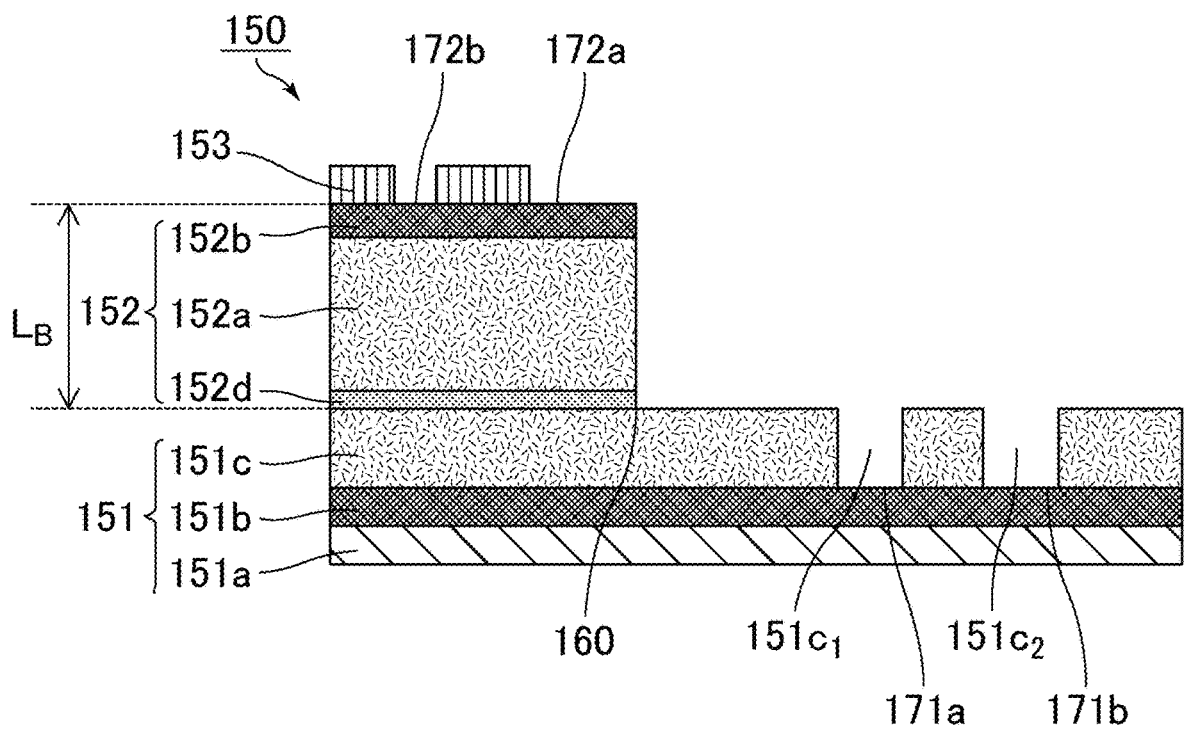
FIG. 9A is a side sectional view schematically showing a method for measuring the connection resistance value in the evaluation of the flex resistance and the conformability to a step.
Figure 9B:
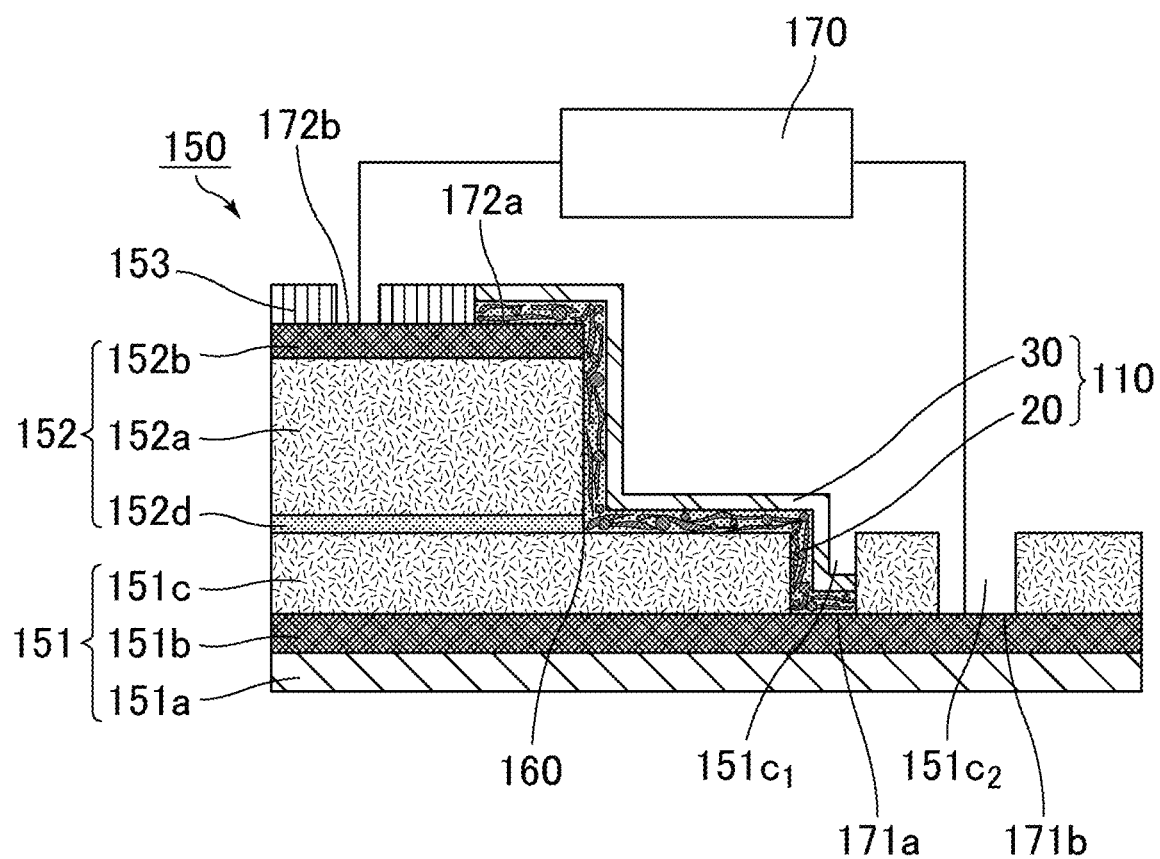
FIG. 9B is a side sectional view schematically showing a method for measuring the connection resistance value in the evaluation of the flex resistance and the conformability to the step.

FIG. 9A and FIG. 9B are side sectional views schematically showing a method for measuring the connection resistance value in the evaluation of the flex resistance and the conformability to the step.

A printed wiring board 150 for measuring the connection resistance value shown in FIG. 9A was first provided.

The printed wiring board 150 for measuring the connection resistance value is constituted of a printed wiring board portion 151 and a step-forming portion 152 formed on the printed wiring board portion 151.

The printed wiring board portion 151 includes a base film 151a, a lower copper layer 151b layered on the base film 151a, and a coverlay 151c formed on the lower copper layer 151b.

The lower copper layer 151b has a lower electromagnetic wave shielding film arrangement portion 171a and a lower terminal connecting portion 171b, and a first groove $151c_1$ and a second groove $151c_2$ for exposing these are formed in the coverlay 151c.

That is, the lower electromagnetic wave shielding film arrangement portion 171a is exposed from the first groove $151c_1$, and the lower terminal connecting portion 171b is exposed from the second groove $151c_2$.

The lower terminal connecting portion 171b is plated with nickel-gold.

The step-forming portion 152 includes an adhesive layer 152d, an insulating layer 152a for forming the step formed on the adhesive layer 152d, and an upper copper layer 152b formed on the insulating layer 152a for forming the step.

The step-forming portion 152 is arranged on the printed wiring board portion 151 through the adhesive layer 152d to form a step 160. The upper copper layer 152b is plated with nickel-gold.

The upper copper layer 152b has an upper electromagnetic wave shielding film arrangement portion 172a and an upper terminal connecting portion 172b, and a resist 153 is formed on the upper copper layer 152b so that these are exposed.

The height of the step on the printed wiring board 150 for measuring the connection resistance value (the distance indicated with the reference sign $L_B$ in FIG. 9A) was 288 µm.

As shown in FIG. 9B, the electromagnetic wave shielding film 110 according to each of Examples or each of Comparative Examples was then pasted on the printed wiring board 150 for measuring the connection resistance value so that the electroconductive adhesive layer 20 of the electromagnetic wave shielding film 110 was on the step 160 side. The printed wiring board 150 on which the electromagnetic wave shielding film was pasted was compression bonded with a press under the conditions of temperature: 170° C., time: 30 minutes, and pressure: 3 MPa.

The electroconductive adhesive layer 20 is in contact with the lower electromagnetic wave shielding film arrangement portion 171a, and the electroconductive adhesive layer 20 is in contact with the upper electromagnetic wave shielding film arrangement portion 172a thereby. Consequently, the lower copper layer 151b and the upper copper layer 152b can be electrically connected through the electroconductive adhesive layer 20.

Then, terminals were connected to the lower terminal connecting portion 171b and the upper terminal connecting portion 172b, and the electrical resistance value was measured with a resistor 170. Table 1 and Table 2 show the measurement results.

Then, the appearance of each electromagnetic wave shielding film at the step 160 was observed and evaluated.

The evaluation criterion is as follows. Table 1 and Table 2 show the results.

Good: Rupture or separation does not occur.

Poor: Rupture and/or separation occurs.

The term "rupture" means a state in which at least a part of the electromagnetic wave shielding film is torn at the step 160.

The term "separation" means a state in which the width of the slant of the electromagnetic wave shielding film formed by the step 160 exceeds 100 µm when the electromagnetic wave shielding film arranged on the printed wiring board 150 for measuring the connection resistance value is planarly viewed from above. This "separation" is a phenomenon caused when a void is created between the electromagnetic wave shielding film and the printed wiring board 150 for measuring the connection resistance value.

Pictures in using the electromagnetic wave shielding films according to Example 1, Comparative Example 5, and Comparative Example 6 are given as examples of the above-mentioned evaluation of the appearances.

Figure 10A:
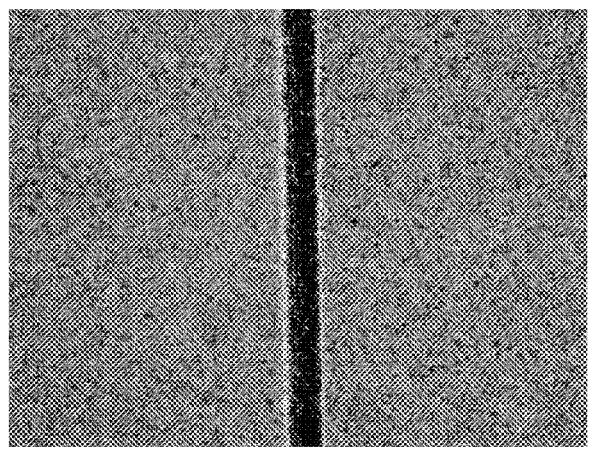
FIG. 10A is a picture obtained by photographing a step of the electromagnetic wave shielding film according to Example 1 after the compression bonding to a printed wiring board for measuring the connection resistance value as a plan view from above in the evaluation of the flex resistance and the conformability to the step.

FIG. 10A is a picture obtained by photographing a step of the electromagnetic wave shielding film according to Example 1 after the compression bonding to a printed wiring board for measuring the connection resistance value as a plan view from above in the evaluation of the flex resistance and the conformability to the step.

Figure 10B:
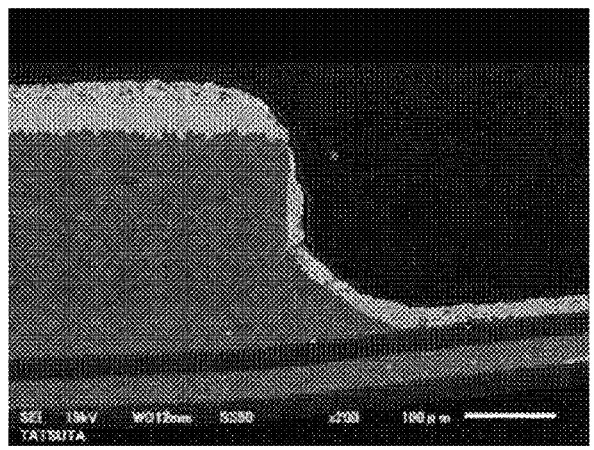
FIG. 10B is a picture of a cross section of the step of the electromagnetic wave shielding film according to Example 1 after the compression bonding to a printed wiring board for measuring the connection resistance value in the evaluation of the flex resistance and the conformability to the step.

FIG. 10B is a picture of a cross section of the step of the electromagnetic wave shielding film according to Example 1 after the compression bonding to a printed wiring board for measuring the connection resistance value in the evaluation of the flex resistance and the conformability to the step.

Figure 11:
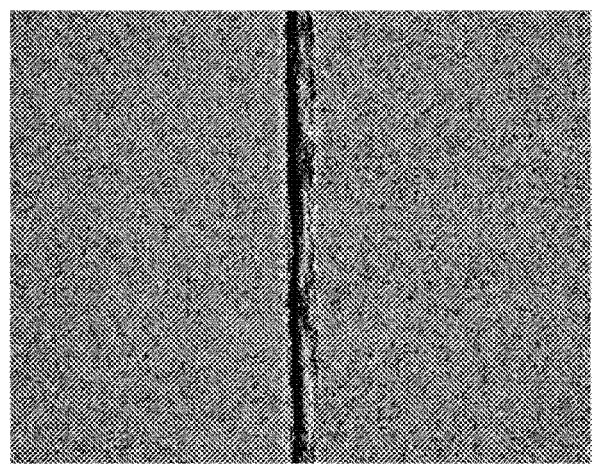
FIG. 11 is a picture obtained by photographing a step of an electromagnetic wave shielding film according to Comparative Example 5 after the compression bonding to a printed wiring board for measuring the connection resistance value as a plan view from above in the evaluation of the flex resistance and the conformability to the step.

FIG. 11 is a picture obtained by photographing a step of an electromagnetic wave shielding film according to Comparative Example 5 after the compression bonding to a printed wiring board for measuring the connection resistance value as a plan view from above in the evaluation of the flex resistance and the conformability to the step.

Figure 12A:
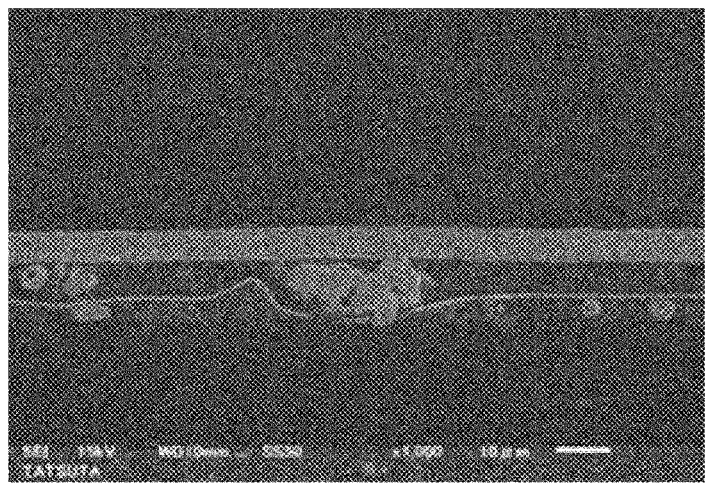
FIG. 12A is a picture obtained by photographing a step of the electromagnetic wave shielding film according to Comparative Example 6 after the compression bonding to a printed wiring board for measuring the connection resistance value as a plan view from above in the evaluation of the flex resistance and the conformability to the step.

FIG. 12A is a picture obtained by photographing a step of the electromagnetic wave shielding film according to Comparative Example 6 after the compression bonding to a printed wiring board for measuring the connection resistance value as a plan view from above in the evaluation of the flex resistance and the conformability to the step.

Figure 12B:
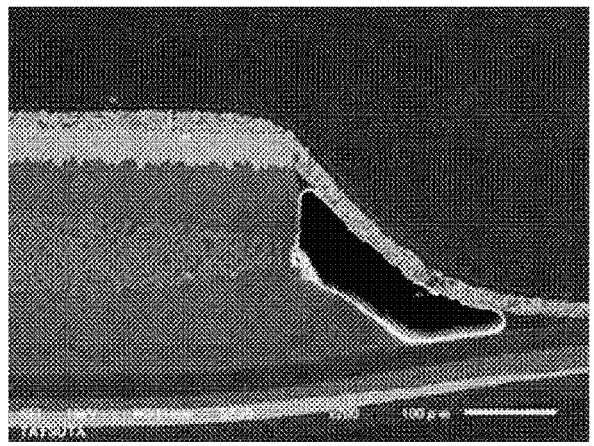
FIG. 12B is a picture of a cross section of the step of the electromagnetic wave shielding film according to Comparative Example 6 after the compression bonding to a printed wiring board for measuring the connection resistance value in the evaluation of the flex resistance and the conformability to the step.

FIG. 12B is a picture of a cross section of the step of the electromagnetic wave shielding film according to Comparative Example 6 after the compression bonding to a printed wiring board for measuring the connection resistance value in the evaluation of the flex resistance and the conformability to the step.

As shown in FIG. 11, in the above-mentioned observation of the appearance, a "rupture" occurred in the electromagnetic wave shielding film according to Comparative Example 5.

As shown in FIG. 12A and FIG. 12B, in the observation of the appearance, a "separation" occurred in the electromagnetic wave shielding film according to Comparative Example 6.

As shown in Table 1 and Table 2, it has been proved that the electromagnetic wave shielding film according to Examples of the present invention can be thinned, has high peel strength, and is excellent in electroconductivity, shielding properties, and flex resistance and conformability to a step.

REFERENCE SIGNS LIST

10, 110: Electromagnetic wave shielding film
20: Electroconductive adhesive layer
21: Electroconductive particle
21*a*: Flaky electroconductive particle
21*b*: Spherical electroconductive particle
22: Adhesive resin composition
30: Insulating layer
40: Metal layer
50: Printed wiring board
50A: Printed wiring board for measuring connection resistance value
51: Base film
52: Printed circuit
52*a*: Ground circuit
53: Coverlay
53*a*: Opening
60: Shielded printed wiring board
70: Resistor
80: Electromagnetic wave shielding effect measuring apparatus
83: Measurement jig
84: Central conductor
91: Spectrum analyzer
92, 93: Attenuator
94: Preamplifier
150: Printed wiring board for measuring connection resistance value
151: Printed wiring board portion
151*a*: Base film
151*b*: Lower copper layer
151*c*: Coverlay
151*c_1$: First groove
151*c_2$: Second groove
152: Step-forming portion
152*a*: Insulating layer for forming step
152*b*: Upper copper layer
152*d*: Adhesive layer
153: Resist
160: Step
170: Resistor
171*a*: Lower electromagnetic wave shielding film arrangement portion
171*b*: Lower terminal connecting portion
172*a*: Upper electromagnetic wave shielding film arrangement portion
172*b*: Upper terminal connecting portion

The invention claimed is:

1. An electromagnetic wave shielding film comprising:
an electroconductive adhesive layer comprising electroconductive particles and an adhesive resin composition,
the electroconductive particles comprising flaky electroconductive particles and spherical electroconductive particles,
an average particle size of the spherical electroconductive particles being 1 to 10 μm,
a content of the flaky electroconductive particles and the spherical electroconductive particles in the electroconductive adhesive layer being 70 to 80% by weight,
a weight ratio of the flaky electroconductive particles to the spherical electroconductive particles, [flaky electroconductive particles]/[spherical electroconductive particles], being 6/4 to 8/2,
a thickness of the electroconductive adhesive layer being 5 to 20 μm, and
the electroconductive particles being copper and/or silver-coated copper.

2. The electromagnetic wave shielding film according to claim 1, further comprising an insulating layer.

3. The electromagnetic wave shielding film according to claim 2, further comprising a metal layer between the insulating layer and the electroconductive adhesive layer.

4. A shielded printed wiring board, comprising:
a printed wiring board including a base film, a printed circuit arranged on the base film, and a coverlay arranged so as to cover the printed circuit; and
an electromagnetic wave shielding film including an electroconductive adhesive layer containing electroconductive particles and an adhesive resin composition, the electromagnetic wave shielding film being arranged on the printed wiring board such that the electroconductive adhesive layer is in contact with the coverlay, the electroconductive particles including flaky electroconductive particles and spherical electroconductive particles, an average particle size of the spherical electroconductive particles being 1 to 10 μm, a content of the flaky electroconductive particles and the spherical electroconductive particles in the electroconductive adhesive layer being 70 to 80% by weight, a weight ratio of the flaky electroconductive particles to the spherical electroconductive particles, [flaky electroconductive particles]/[spherical electroconductive particles], being 6/4 to 8/2, a thickness of the electroconductive adhesive layer being 5 to 20 μm, and the electroconductive particles being copper and/or silver-coated copper.

5. The shielded printed wiring board according to claim 4, wherein the printed circuit comprises a ground circuit, the coverlay has an opening formed therein for exposing the ground circuit, and the electroconductive adhesive layer fills the opening and is contact with the ground circuit.

6. The shielded printed wiring board according to claim 4, wherein an insulating layer is arranged on a side of the electroconductive adhesive layer not in contact with the coverlay.

7. The shielded printed wiring board according to claim 6, wherein a metal layer is arranged between the electroconductive adhesive layer and the insulating layer.

\* \* \* \* \*